United States Patent
Farmer, II (10) Patent No.: US 6,303,942 B1
(45) Date of Patent: *Oct. 16, 2001

(54) MULTI-LAYER CHARGE INJECTION BARRIER AND USES THEREOF

(76) Inventor: Kenneth Rudolph Farmer, II, 345 Dunellen Ave., Dunellen, NJ (US) 08812

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/042,974

(22) Filed: Mar. 17, 1998

(51) Int. Cl.$^7$ .................................................. H01L 29/06
(52) U.S. Cl. ............................................. 257/30; 257/351
(58) Field of Search ............................. 257/25, 368, 30, 257/315, 321; 438/264

(56) References Cited

U.S. PATENT DOCUMENTS

| | | |
|---|---|---|
| 4,019,197 | 4/1977 | Lohstroh et al. . |
| 4,112,507 | 9/1978 | White et al. . |
| 4,115,914 | 9/1978 | Harari . |
| 4,203,158 | 5/1980 | Frohman-Benchkowsky et al. . |
| 5,216,262 | 6/1993 | Tsu . |
| 5,466,949 | * 11/1995 | Okuno .................................. 257/25 |
| 5,511,020 | * 4/1996 | Hu et al. .......................... 365/185.28 |
| 5,606,177 | * 2/1997 | Wallace et al. ........................ 257/25 |
| 5,757,051 | * 5/1998 | Wu et al. .............................. 257/368 |
| 5,869,370 | * 2/1999 | Chuang et al. ....................... 438/264 |
| 5,885,870 | * 3/1999 | Maiti et al. ........................... 438/261 |
| 5,952,692 | 9/1999 | Nakazato et al. ..................... 257/321 |

FOREIGN PATENT DOCUMENTS

| | | | |
|---|---|---|---|
| 52-32359 | * 7/1974 | (JP) ...................................... 257/321 |

OTHER PUBLICATIONS

Chen and Wu, 1986, Solid–State Electronics, 29:1059.
Dressendorfer, 1978, Interface and Electron Tunneling Properties of Thin Oxides on Siicon, Ph. D. Thesis, Yale University, 141:149.
Farmer et al, 1992, Appl. Phys. Lett., 60:730.
Gu et al, 1997, Materials Research Society Proceedings, Amorphous and Microcrocrystalline Silicon Technology, 467:367.
Hanafi et al, 1996, IEEE Trans Electron Devices, 43:1553.
Hattori, 1993, J Vac Sci Tech, B1528.
Mars et al, 1993, J Vac Sci Tech, B965.
Ohmi et al, 1992, Appl Phys Lett, 2126.
Ozbay et al, 1991, IEEE Elect Dev Lett, 480.
Prince,1996, Semiconductor Memories, A Handbook of Design, Manufacture, and Appllication, 2nd Ed., John Wiley and Sons, New York, 183.
Seiple et al, 1993, J Vac Sci Tech, A1649.
Tiwari, 1996, The Physics and Chemistry of Sio2 and the Si–Sio2 interface–3, Massoud et al ed. 96:250, The Electrochemichal Society, Pennington,NJ.
Wang et al, 1996, Jap J Appl Phys, Pt. 1:3369.

* cited by examiner

Primary Examiner—Long Pham
Assistant Examiner—William David Coleman
(74) Attorney, Agent, or Firm—Klauber & Jackson (57) ABSTRACT

The present invention relates to a tunnel barrier and to uses thereof, particularly in conjunction with devices and integrated circuits fabricated with silicon substrates, and including the preparation of tunnel diodes, dielectric structures, transistors, memory cells and the products embodying one or more of the same. The tunnel barrier of the invention is designed to confer effective and reliable charge transfer performance, and is particularly well suited for the fabrication of nonvolatile memory cells. In an embodiment of the invention, with the barrier incorporated in a diode, the present evacuee facilitates over $10^9$ bi-directional charge transfers across the barrier without destroying it. The multiple layer nature of the barrier, coupled with the use of direct tunnel oxides, provides desirable functionality, stability, and resistance to dielectric degradation, thus improving operating, storage and retention characteristics over conventional nonvolatile devices.

28 Claims, 8 Drawing Sheets

MULTI-LAYER CHARGE INJECTION BARRIER AND USES THEREOF

GOVERNMENTAL SUPPORT

The research leading to the present invention was funded in part by Contract Grant No.s ECS-9530984 and ECS-9624798 of the National Science Foundation. The Government may have certain rights in the invention.

BACKGROUND OF THE INVENTION

1. Field of the Invention

The present invention relates generally to microelectronic devices, and particularly to devices that may serve as tunneling devices and systems, such as tunneling diodes, and extends to electrically erasable and programmable read only memory (abbreviated as "EEPROM").

2. Description of the Related Art

The continual demand for enhanced transistor and integrated circuit performance has resulted in improvements in existing devices, such as silicon bipolar and complementary metal-oxide-silicon (CMOS) transistors and gallium arsenide metal-semiconductor field effect transistors (MESFETs), and also in the introduction of new device types and materials. In particular, scaling down device sizes to enhance high frequency performance leads to observable quantum mechanical effects such as carrier tunneling through potential barriers. This has led to development of alternative device structures such as resonant tunneling diodes and resonant tunneling hot electron transistors that take advantage of such tunneling phenomena.

Figure 1:
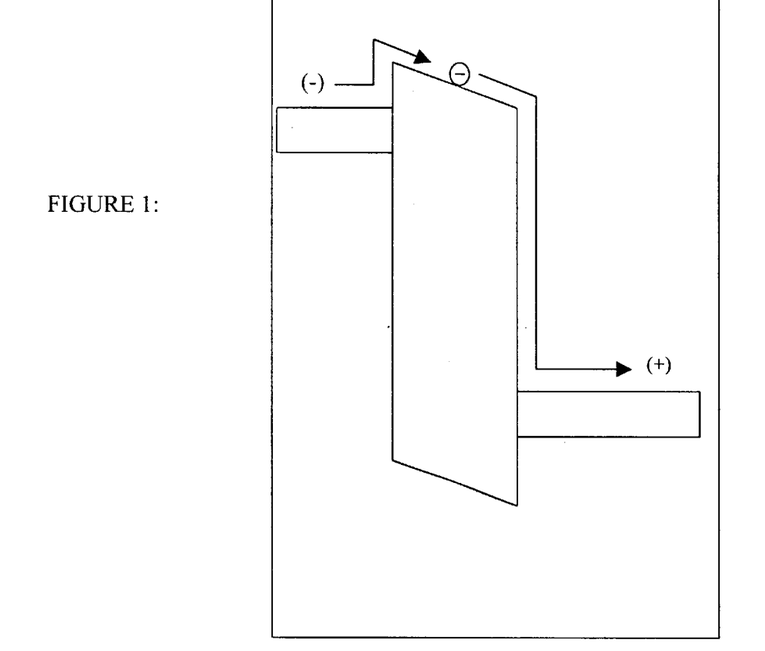
FIG. 1 is a band diagram illustrating the avalanche injection process. [Betty Prince, *Semiconductor Memories, A Handbook of Design, Manufacture, and Application*, 2$^{nd}$ ed. (John Wiley and Sons, New York, N.Y., 1996) p. 183].
Figure 2:
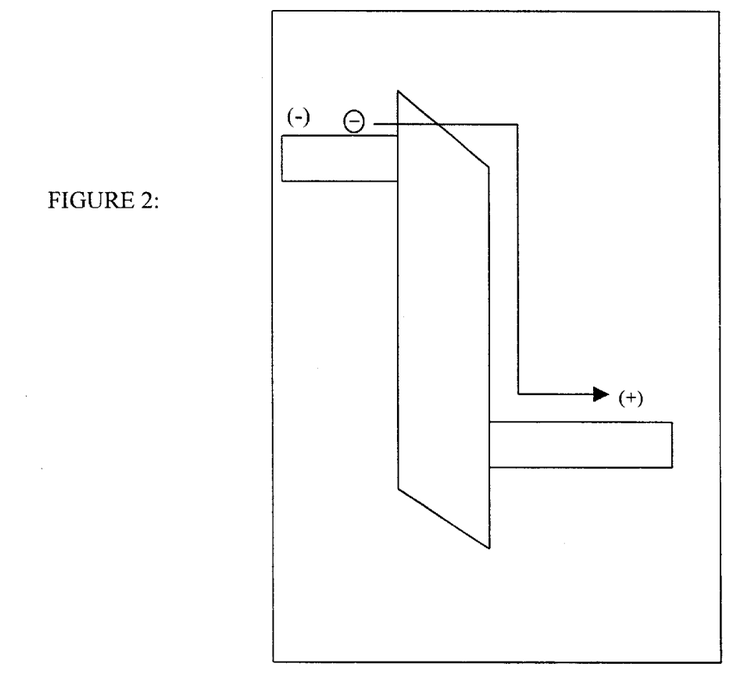
FIG. 2 is a band diagram illustrating the FN tunneling process. [Betty Prince, *Semiconductor Memories, A Handbook of Design, Manufacture, and Application*, 2$^{nd}$ ed. (John Wiley and Sons, New York, N.Y., 1996) p. 183].
Figure 3:
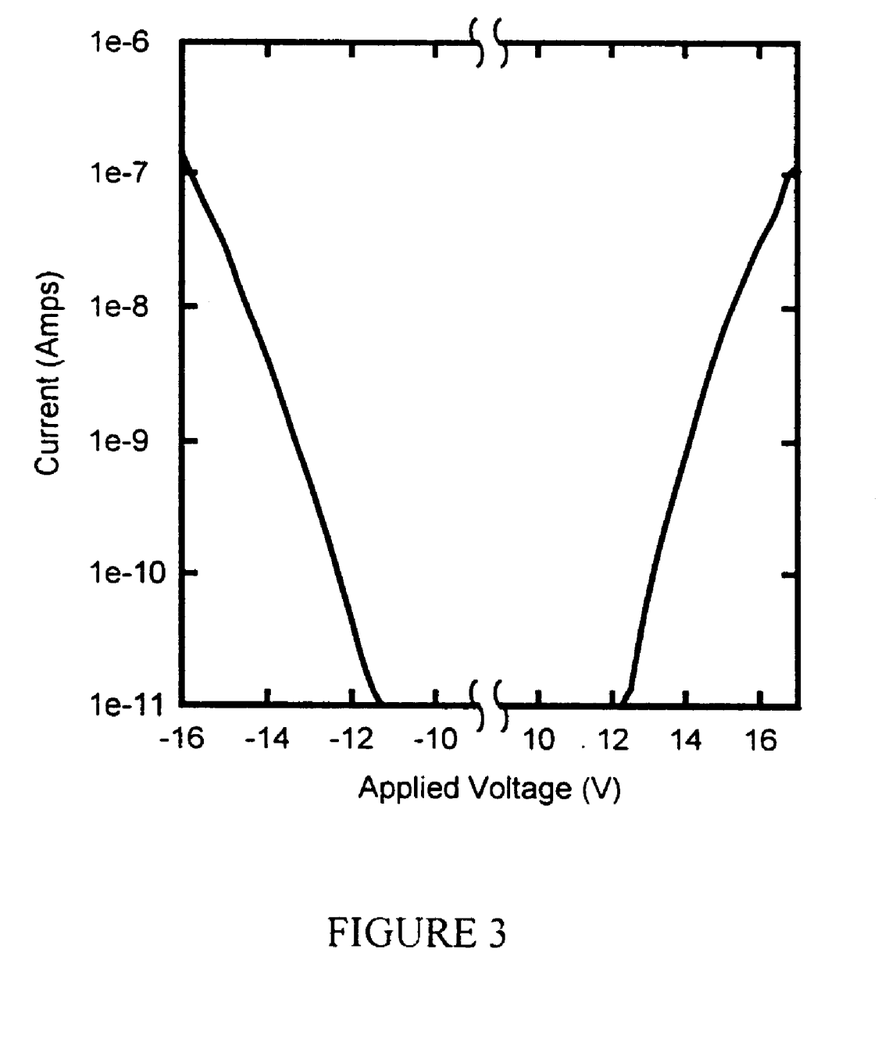
FIG. 3 is a current voltage diagram of a known Fowler-Nordheim tunneling diode fabricated using a p-silicon substrate and a polycrystalline silicon top electrode. The oxide thickness is 15.5 nm. [C. F. Chen and C. Y. Wu, "A Characterization Model for Ramp-Voltage-Stressed I-V Characteristics of Thin Thermal Oxides Grown on Silicon Substrate," *Solid-State Electronics* 29, 1059 (1986).]

More specifically, thin tunnel dielectric floating gate memory devices are also known in the art. In such devices, charge carriers are transported into and out of the floating metal or silicon gates through a relatively thin portion of a single layer of oxide (~10 nm) located between the floating gate and the device substrate. Transport mechanisms include Fowler-Nordheim (FN) tunneling through a triangular potential barrier or avalanche injection over the barrier. Thus in both cases, writing and erasing involve injection of charge into the conduction band of the oxide. Band diagrams illustrating the avalanche injection and FN processes are shown in FIGS. 1 and 2, respectively. [Betty Prince, *Semiconductor Memories, A Handbook of Design, Manufacture, and Application*, 2$^{nd}$ ed. (John Wiley and Sons, New York, N.Y., 1996) p. 183] Nonvolatility is possible because there exists a large bias region (at least several volts) between the write and erase bias levels where charge is not readily transported across the oxide by these mechanisms. This is illustrated by the current-voltage diagram of a known FN tunnel diode shown in FIG. 3. Examples of thin tunnel dielectric floating gate memory devices are given in U.S. Pat. No. 4,019,197 to Lohstroh et al., U.S. Pat. No. 4,115,194 to Harari, and U.S. Pat. No. 4,203,158 to Frohman-Benchkowsky.

The FN and avalanche injection processes are known to degrade the oxide with the result that conventional devices can be cycled only a limited number of times (~$10^3$—$10^6$) before the oxide fails. Once the oxide fails even locally, the whole floating gate is shorted to the substrate and charge storage is impossible. One attempt to remedy the problem has been to replace the floating gate metal or silicon with an insulating silicon nitride material, enabling the capture and emission of charge at localized trap sites related to the presence of the nitride. An example of such a device is given in U.S. Pat. No. 4,112,507 to White et al. In this type of system, oxide failure at one trap site does not lead to total device failure. These devices can endure up to ~$10^8$ write/erase cycles. Other silicon-based approaches to nonvolatile storage, such as "flash" technology can also lead to as much as ~$10^8$ write/erase cycles, but all of these approaches are still limited by the reliability of the dielectric under the stress of writing and erasing by FN tunneling or avalanche injection.

Figure 4:
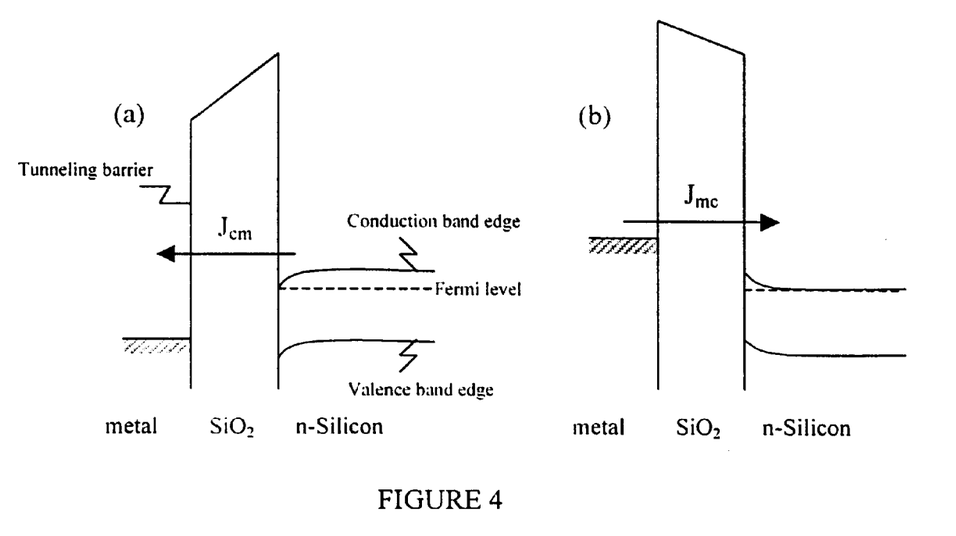
FIGS. 4A–B are band diagrams of a known direct tunneling diode fabricated using an n-silicon substrate. The arrows indicate the direction of electron current flow. (a) Positive voltage is applied to the gate metal, and the silicon surface is in accumulation. (b) Negative voltage is applied to the gate metal, and the silicon surface is in inversion. [P. V. Dressendorfer, *Interface and Electron Tunneling Properties of Thin Oxides on Silicon*, Ph.D. thesis, Yale University, 1978, p. 149.]
Figure 5:
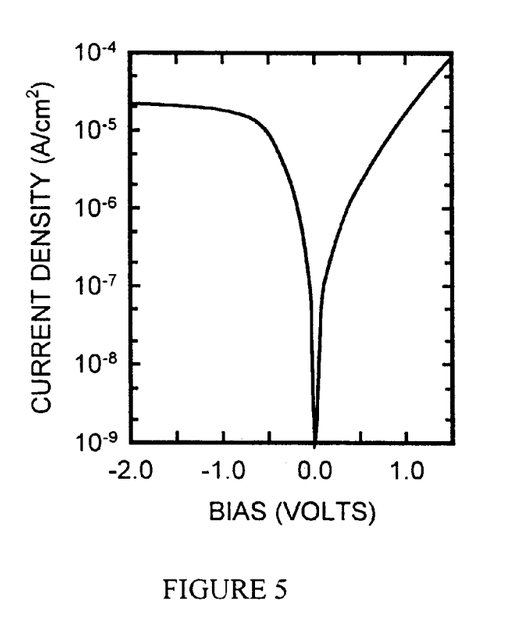
FIG. 5 is a Current voltage diagram of a known direct tunneling diode fabricated using an n-silicon substrate. [P. V. Dressendorfer, *Interface and Electron Tunneling Properties of Thin Oxides on Silicon*, Ph.D. thesis, Yale University, 1978, p. 141.]

A modified approach to charge storage involves using a single layer direct tunnel (DT) oxide to separate the floating gate from the substrate. Direct tunnel oxides are so thin that significant tunneling is possible across the whole thickness of the dielectric, through a trapezoidal potential barrier, without the need for injection into the oxide conduction band. Band diagrams and the resulting current voltage behavior for the direct tunneling mechanism of charge injection are shown in FIGS. 4 and 5, respectively. [P. V. Dressendorfer, *Interface and Electron Tunneling Properties of Thin Oxides on Silicon*, Ph.D. thesis, Yale University, 1978, pp. 141 and 149.] Significant nonvolatility has not been shown to be possible in conventional type devices with single layer DT oxides because, unlike for thicker FN or avalanche oxides, there is no bias region between the write and erase levels where substantial tunnel leakage does not occur. This is evident in the plot of FIG. 5.

Nonetheless, using DT oxides would still be advantageous because of an effect discovered by the present applicant, that DT oxides do not seem to degrade if the voltage across them is kept within the range $-3$ V<$V_{gate}$<+1 V. [K. R. Farmer, M. O. Andersson and O. Engstrom, "Tunnel Electron Induced Charge Generation in Very Thin Silicon Oxide Dielectrics," *AppL. Phys. Lett.* 60, 730 (1992)] One memory device that attempts to exploit this advantage, proposed by researchers at IBM, is a quasi-nonvolatile device where charge storage is done on isolated nano-crystals of silicon, separated from the substrate by a direct tunnel oxide. [H. I. Hanafi, S. Tiwari and I. Khan, "Fast and Long Retention-Time Nano-Crystal Memory," *IEEE Trans. Electron Devices* 43, 1553 (1996); and S. Tiwari, "Silicon Nano-Crystal Memories: Devices in the Limit of Conventional Miniaturization," in *The Physics and Chemistry of SiO$_2$ and the Si-SiO$_2$ Interface*—3, H. Z. Massoud, E. H. Poindexter, and C. R. Helms, Editors, Proc. Vol. 96–1, p. 250, The Electrochemical Society, Pennington, N.J., 1996] The device shows that over $10^9$ cycles are possible using direct tunnel oxides, but it is not truly nonvolatile because, even though a Coulomb blockade effect associated with the nano-crystals may be present to enhance charge retention, still the stored charge leaks off the nano-crystal sites over a period of hours.

Figure 6:
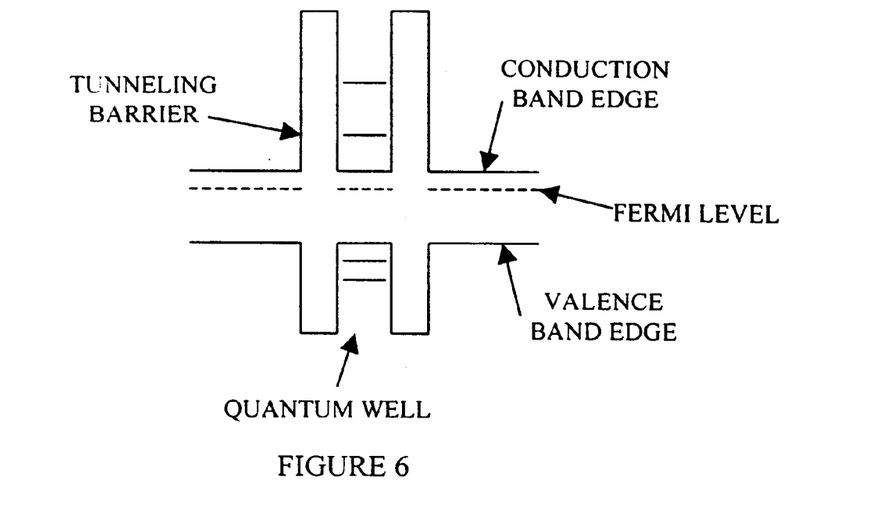
FIG. 6 is a representative band diagram for an unbiased resonant tunneling diode. [R. M. Wallace and A. C. Sebaugh, "Silicon Oxide Resonant Tunneling Diode Structure," U.S. Pat. No. 5,606,177, Feb. 25, 1997.]

FN or direct tunneling diodes are the heart of the previous memory constructions. A more complex diode that is also known in the art is the resonant tunneling diode (RTD) structure. These devices rely on resonant tunneling through a quantum well in a single band. RTDs are two terminal devices with conduction carriers tunneling through trapezoidal potential barriers to yield current-voltage curves with portions exhibiting negative differential resistance. A representative band diagram for an unbiased RTD is shown in FIG. 6. The original Esaki diode had interband tunneling (e.g., from conduction band to valence band) in a heavily doped pn junction diode. In some materials systems, such as strained layer SiGe/Si heterostructures, the valence band offset greatly exceeds the conduction band offset at the interfaces, thus in these systems most investigators consider the tunneling of holes rather than electrons.

Mars et al., "Reproducible Growth and Application of AlAs/GaAs Double Barrier Resonant Tunneling Diodes," *J.*

Figure 7:
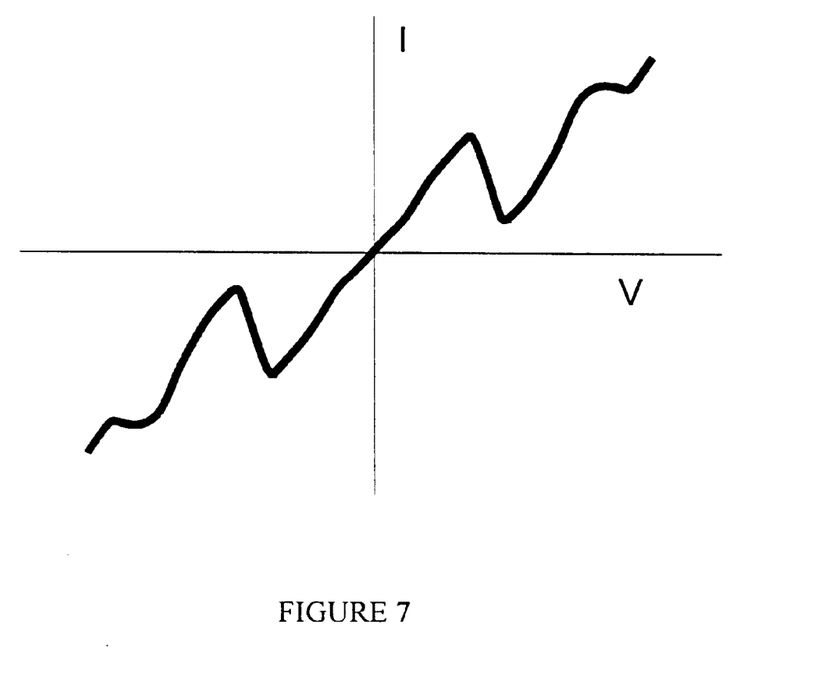
FIG. 7 is a current-voltage diagram for a room temperature RTD. [R. M. Wallace and A. C. Sebaugh, "Silicon Oxide Resonant Tunneling Diode Structure," U.S. Pat. No. 5,606, 177, Feb. 25, 1997.]
Figure 8:
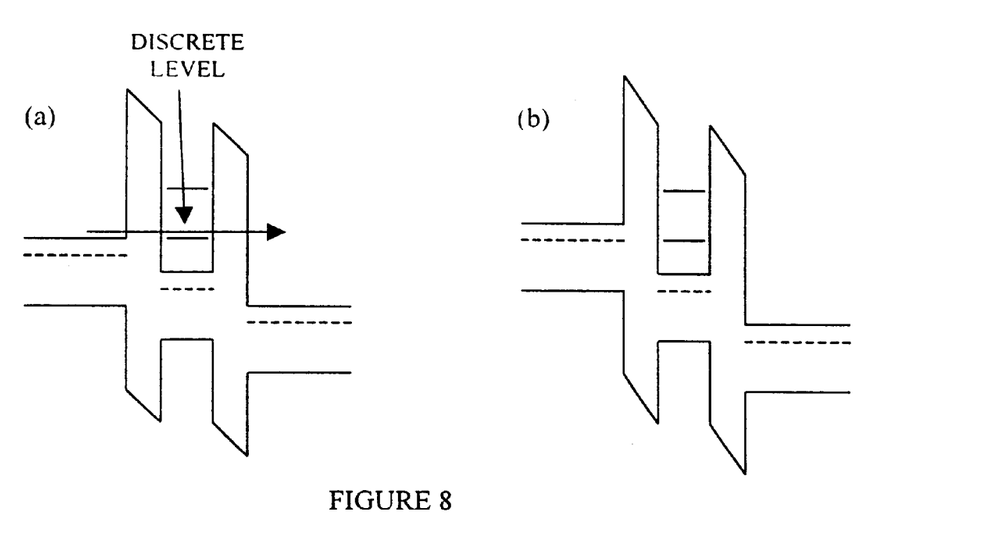
FIGS. 8A–B are band diagrams of a known resonant tunneling diode. (a) A discrete electron level (bottom edge of a subband) in the quantum well aligns with the cathode conduction band edge, so electron tunneling readily occurs, and the current is large. (b) The cathode conduction band aligns between quantum well levels and suppresses tunneling, and the current is small. [R. M. Wallace and A. C. Sebaugh, "Silicon Oxide Resonant Tunneling Diode Structure," U.S. Pat. No. 5,606,177, Feb. 25, 1997.]

Vac. Sci. Tech. B 965 (1993); and Özbay et al., "110–GHz Monolithic Resonant-Tunneling-Diode Trigger Circuit," IEEE Elec. Dev. Lett. 480 (1991), each use two AlAs tunneling barriers imbedded in a GaAs structure to form a quantum well RTD. The quantum well may be 4.5 nm thick with 1.7 nm thick tunneling barriers. FIG. 7 illustrates current-voltage behavior at room temperature. Note that such resonant tunneling diodes are symmetrical. With the bias shown in FIG. 8a, a discrete electron level (bottom edge of a subband) in the quantum well aligns with the cathode conduction band edge, so resonant electron tunneling readily occurs, and the current is large. In contrast, with the bias shown in FIG. 8b, the cathode conduction band aligns between quantum well levels and suppresses tunneling, and the current is small. For device applications, negative resistance is the distinguishing feature of the RTD's, and by itself would not necessarily be expected to improve the retention characteristics of nonvolatile memory because, as illustrated in FIG. 7, tunnel leakage might still be expected.

Tsu, U.S. Pat. No. 5,216,262, describes a silicon-based quantum well structure with tunneling barriers made of short period silicon/silicon dioxide superlattices of epitaxial silicon dioxide two monolayers thick. Wallace et al., U.S. Pat. No. 5,606,177, describe a silicon oxide RTD structure comprising a silicon/silicon-oxide/silicon/silicon-oxide/silicon heterostructure with quantum well and tunnel oxides less than 3 nm thick.

Numerous investigators have studied the silicon/silicon oxide interface because it underlies performance of the currently prevalent CMOS transistor structure of silicon integrated circuits. In particular, the growth and analysis of ultra-thin, DT oxides by various means, including chemical and thermal oxidation as well as deposition techniques, have become commonplace. See, for example the references noted above to Dressendorfer and to Farmer, et al. The growth and analysis of DT oxides extends to dielectrics comprised of as little as a single molecular layer, as demonstrated in, for example, Ohmi et al., "Very Thin Oxide Film on a Silicon Surface by Ultraclean Oxidation," Appl. Phys. Lett. 2126 (1992); Hattori, "High Resolution X-Ray Photoemission Spectroscopy Studies of Thin $SiO_2$ and $Si/SiO_2$ Interfaces," J. Vac. Sci. Tech. B 1528 (1993); and Seiple et al., "Elevated Temperature Oxidation and Etching of the Si(111) 7×7 Surface Observed with Scanning Tunneling Microscopy," J. Vac. Sci. Tech. A 1649 (1993). The Ohmi et al., article observes that an oxide monolayer formed on a silicon wafer at 300° C. provides the foundation for oxide films superior to standard thermal oxide with respect to Frenkel-Poole emission for thin oxide films.

Deposition and oxidation of ultra-thin silicon films such as amorphous or polycrystalline silicon layers are also known in the art, particularly for their use in thin film transistors and nonvolatile memories, but also in RTD structures. For example, Wang, et al., "Excellent Emission Characteristics of Tunneling Oxides Formed Using Ultrathin Silicon Films for Flash Memory Devices," Jap. J. Appl. Phys., Pt. 1, 3369 (1996), describe the oxidation of 4.0 nm thick polycrystalline and amorphous silicon films vapor deposited on silicon substrates. Also, Gu, et al., "Observation of Coulomb Blockade Effect in Silicon Nanocrystallites at Room Temperature," in Materials Research Society Proceedings, Amorphous and Microcrystalline Silicon Technology, Vol. 467, p. 367, 1997, describe a nano-crystalline silicon/amorphous silicon oxide RTD in which the average grain-size of "well isolated" silicon quantum dots in the nano-crystalline layer is ~10 nm. The minimum thickness has not been determined for a continuous, deposited nano-crystalline silicon film on silicon oxide, not made up of isolated crystallites.

To summarize, in all current realizations of nonvolatile charge storage devices where charge transfer occurs by FN tunneling or avalanche injection across a single oxide layer, the reliability of the dielectric limits the number of possible write/erase cycles. When a DT oxide has been used to improve the maximum number of read/write cycles in a novel nano-crystal device, retention has become an issue. A need therefore continues to exist to develop and implement device structures that overcome these drawbacks, and it is toward the fulfillment of this need that the present invention is directed. Our solution to this problem is to form a barrier with improved reliability and retention, writing and erasing by sequential direct tunneling.

SUMMARY OF THE INVENTION

In its broadest aspect, the present invention relates to a tunnel barrier for non-limiting use in structures such as diodes, which is based and designed for use in and with silicon/silicon oxide semiconductor device constructions, the barrier being characterized in part by increased effectiveness and reliability of operation and resistance to degradation. The barrier of the invention comprises a tunnel barrier capable of association with a silicon substrate and a top gate material, the tunnel barrier in turn, comprising (a) a first thin silicon oxide layer adapted for contact with the said silicon substrate, said first thin silicon oxide layer having a direct tunnel thickness of less than about 5.0 nm; (b) an intermediate layer of silicon in contact with the said first thin silicon oxide layer, and in one embodiment, a thickness that may be comparable to that of the said first thin silicon oxide layer; and (c) a second thin silicon oxide layer comparable to the said first thin silicon oxide layer in contact with the said intermediate silicon layer and adapted for contact with the top gate material. The barrier functions to transfer charge across the barrier by tunneling through the oxide layers via the conduction or valence band of the intermediate layer of silicon. The gate material may be a metal or semiconductor layer, which may be silicon. In a particular embodiment of the invention, the first and second silicon oxide layers are thermally grown amorphous silicon dioxide and the intermediate layer of silicon is polycrystalline silicon, and more particularly is undoped polycrystalline silicon. In this same embodiment, with the barrier incorporated into a diode structure, the substrate is crystalline n-silicon and the gate material is n-polycrystalline silicon, with doping atoms present in at least a portion of each material.

The barrier of the invention may be particularly designed for nonvolatile applications, as a dielectric for dynamic memory applications, for field effect transistors (FETs) and as part of static random access memories (SRAMs). A particular application for the present invention is the use of the tunnel barrier in a FETMOS floating gate nonvolatile cell, which technology is at the heart of nonvolatile charge storage devices such as "flash memory." While conventional devices have a useful life that may, for example, permit the cycling of charge for $10^3$–$10^6$ times before the oxide layer fails, the present devices are capable by comparison of in excess of $10^9$ write/erase cycles.

Accordingly it is a principal object of the present invention to provide a tunnel barrier that is effective, stable and reliable in operation, and versatile in application. It is a further objective of the invention to provide a tunnel barrier as aforesaid, that is useful in nonvolatile applications. It is a still further object of the invention to provide a diode structure including the tunnel barrier as aforesaid. It is a still further object of the invention to provide a floating gate nonvolatile cell including the tunnel barrier as aforesaid.

Other objects and advantages will be apparent to those skilled in the art from a consideration of the ensuing detailed description that proceeds with reference to the following illustrative drawings.

DESCRIPTION OF DRAWINGS

FIG. 9 is a transmission electron micrograph of an embodiment of the present invention, in which the barrier is incorporated in a diode structure showing (a) the crystalline n-silicon substrate, (b) the first amorphous oxide layer, (c) the undoped intermediate polycrystalline or nano-crystalline silicon layer, (d) the second amorphous oxide layer, and (e) the top n-polycrystalline silicon layer. Since the silicon lattice constant is ~5.3 Å and the crystalline silicon substrate is <100>-oriented, the diagonal rows of atoms in section (a) of the image are <111> planes spaced 5.34/√2 Å=3.84 Å apart. Thus the physical thickness of the first amorphous oxide layer is ~34 Å, the undoped polycrystalline silicon layer is ~50 Å and the second amorphous oxide layer is ~50 Å. The presence of parallel planes of atoms in the center silicon layer clearly indicates that while this film is continuous, it is nonetheless made up of nano-crystalline grains, and thus can be expected to demonstrate electrical behavior expected of such a material.

DETAILED DESCRIPTION OF THE INVENTION

In accordance with the present invention, a tunnel barrier for use in microelectronic devices such as diodes and more particularly, memory devices, comprises (a) a first thin silicon oxide layer adapted for contact with a silicon substrate, which first thin silicon oxide layer may have a thickness of less than about 5.0 nm; (b) an intermediate layer of silicon in contact with said first thin silicon oxide layer, and c) a second thin silicon oxide layer corresponding to said first thin silicon oxide layer, in contact with said first silicon layer and adapted for contact with a top gate material. The barrier functions to transfer charge across the barrier by tunneling through the oxide layers via the conduction or valence band of the intermediate layer of silicon. The gate material may be a second metal or semiconductor layer, which may be silicon. In a particular embodiment of the invention, the first and second silicon oxide layers are thermally grown amorphous silicon dioxide each of direct tunnel thickness (less than ~5.0 nm); and the intermediate layer of silicon is deposited polycrystalline silicon of approximately the same thickness (less than ~10. nm), and more particularly is undoped polycrystalline silicon. In this same embodiment, with the barrier incorporated into a diode structure, the substrate is crystalline n-silicon and gate material is deposited n-polycrystalline silicon, with doping atoms present in at least a portion of each material.

Form of the Invention

Figure 9:
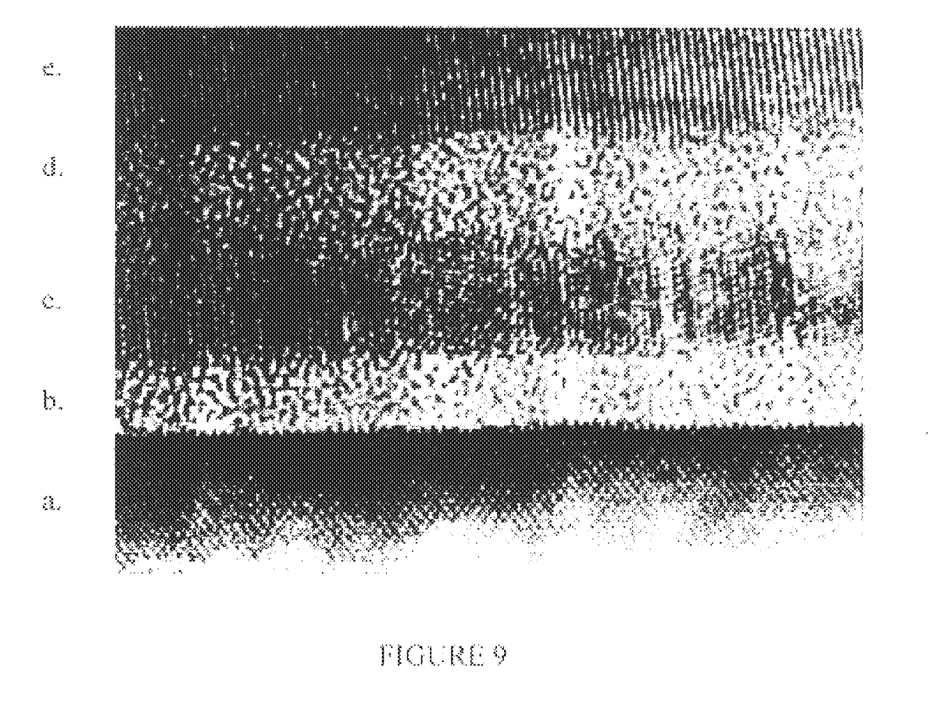

A specific non-limiting form of the invention may be constituted in a diode structure as follows: (a) an n-type silicon substrate doped with ~3×10$^{16}$ phosphorous atoms per cm$^3$; (b) a ~3.4 nm thermally grown amorphous silicon oxide layer; (c) a ~5.0 nm undoped intermediate polycrystalline silicon layer deposited by chemical vapor deposition; (d) a ~5.0 nm thermally grown amorphous silicon oxide layer; and (e) a top gate contact of polycrystalline silicon doped approximately to degeneracy with ~1×10$^{20}$ phosphorous atoms per cm$^3$. A high-resolution transmission electron micrograph of this specific construction is shown in FIG. 9. It should be noted that the average mechanical thickness of the second insulating layer is approximately 5.0 nm, but because of nonuniformities in the thickness of this layer, the electrical thickness may be ~3.4 nm, approximately the same as that of the first insulating layer. This electrical thickness is used for the functional description that follows.

Function of the Invention

The function of the barrier can range from serving as a dielectric with increased reliability, to enabling injection of charge between the substrate and top gate contact via a tunneling process such as tunneling through the conduction band states of the intermediate silicon layer. Incorporated in a diode structure, a specific function of the present invention is illustrated by the energy band diagrams set forth in FIGS. 10A–C.

Thus, with a bias in the range ~–1 V<$V_{bias}$<~+0.5 V applied to the n-polycrystalline silicon (n-poly-Si) little charge can tunnel directly between the n-poly-Si and the n-Si because the total insulating barrier electrical thickness is ~7 nm, too thick for appreciable direct tunneling. Little or no tunneling can occur to the intermediate poly-Si layer because no states are accessible. With negative bias beyond ~–1 V (FIG. 10B), tunneling through the structure is possible via states in the conduction band of the intermediate silicon. Similarly, with positive bias beyond ~+0.5 V (FIG. 10C), tunneling through the structure is again possible via states in the conduction band of the intermediate silicon. The resulting current versus voltage curve is shown in FIG. 11A.

Figure 10:
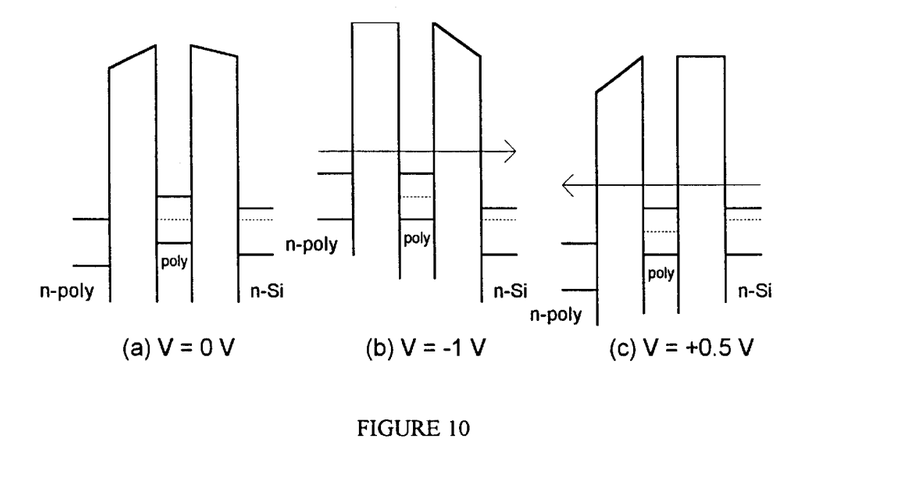
FIGS. 10A–C are band diagrams illustrating the capabilities and performance attributable to the barrier and diode of the invention. In (b) and (c), electron tunneling through the double barrier occurs via states in the conduction band of the intermediate silicon, while in (a) tunneling is much less probable because no states are accessible in the intermediate layer.
Figure 11:
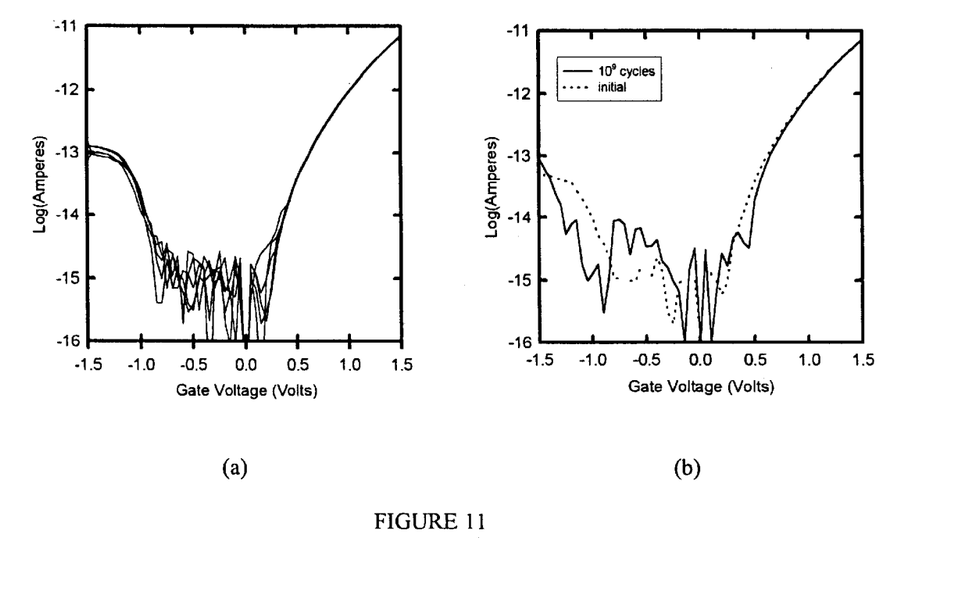
FIGS. 11A–B are compilations of I-V curves depicting the results of repeated stressing of a diode having the multi-layer dielectric barrier of the present invention. Data values below ~3×10$^{-15}$ Amps should be considered to be noise, below the resolution of our measurement apparatus. (a) One diode after 1, 10, 100, 1000, 10$^4$ and 10$^5$ stresses; (b) a different device's initial curve (dashed line) and after 10$^9$ stresses (solid line).

Referring to FIG. 11A, the current increases exponentially near –1 V and +0.5 V applied to the n-poly-Si. The current at higher positive voltages is consistent with tunneling through the structure. The current at higher negative voltages is consistent first with tunneling, then with saturation in an ohmic relationship, the latter indicating that the current is limited by the generation of carriers in the silicon substrate. This saturation current level can be increased by increasing the amount of dopant in the crystalline silicon, which it should be noted may vary in amount, extent and species to accommodate and achieve desired differences in the properties of the resultant barrier. Accordingly, an additional beneficial effect of the increased doping would be to shift the current turn-on voltage for positive biases to a higher value. It should be appreciated that the process described using FIGS. 10B and C is not FN tunneling, direct tunneling through a single layer, or resonant tunneling. Rather, it is sequential tunneling through two barriers via the intermediate silicon layer. Thus, those skilled in the art should appreciate that the principle of sequential tunneling can be used with two or more oxide layers, each separated by a silicon layer. It should be further appreciated that, functionally, the current-voltage behavior of FIG. 11A resembles more that of a FN device than a DT device because of the existence of a bias gap where conduction is limited. In nonvolatile applications, this gap will allow writing and erasing at high bias and stable retention at low bias.

Also shown in FIG. 11A are the results of repeated stressing of the barrier by changing the bias from +1.5 V to –1.5 V repeatedly at ~0.3 Hz, simulating write/erase cycles in a nonvolatile device. It can be seen that the I-V curves hardly change even after $10^5$ cycles. FIG. 11B shows I-V's measured before and after similar stress on a second device at ~1.0 kHz for ~2 weeks, amounting to more than $10^9$ cycles. Again, within the noise, little change is observed even for this very large number of cycles. Certainly the barrier remains intact.

While the present invention appears related to the preparation of resonant tunneling structures, there are differences between the present invention and resonant tunneling structures. For example, resonant tunneling is possible because a uniformly thick ~5.0 nm intermediate poly-Si layer is thin enough to allow the formation of distinct resonant tunneling levels that are separated by energy greater than kT. Resonant tunneling is not a necessary condition either for the function described above or for the successful operation of the intended nonvolatile application described below. The relatively thin layer is necessary however to minimize screening and unwanted charge retention effects.

Applications of the Invention

Figure 12:
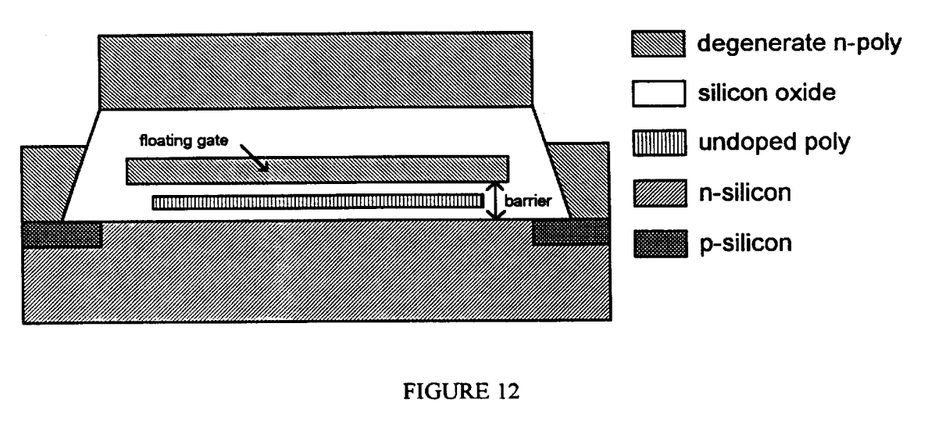
FIG. 12 is a schematic cross-section of a component of a nonvolatile memory cell including the barrier of the present invention.

A number of applications can be envisioned for this structure, including serving as a dielectric for nonvolatile applications, for dynamic memory devices, for field effect transistors (FETs), and as part of static random access memories (SRAMs) a robust dielectric for dynamic memory applications. A specific application envisioned for this structure is that of a component of a nonvolatile memory cell integrated circuit (IC). One configuration is illustrated in FIG. 12 which shows the barrier coupling a floating gate storage layer with the substrate silicon in an FETMOS floating gate nonvolatile cell IC. Writing and erasing of charge on the floating gate is performed by tunneling through the barrier, to and from the substrate silicon. The charge is sensed by a p-channel field effect transistor (FET) formed in the substrate and using a sense/control gate that is separated from the floating gate by a comparatively thick (~10 nm) deposited or grown oxide. (We note that an n-channel device can also be envisioned, with writing to and from an n+ source or drain region.)

Advantages of the Invention

As described in the section "Description of the Related Art," the present device structure was designed with direct tunnel oxides to take advantage of the effect discovered by the present applicant, that DT oxides do not seem to degrade if the voltage across them is kept within the range –3 V<$V_{gate}$<+1 V. This approach overcomes the reliability limitations of conventional nonvolatile charge storage devices where charge transfer occurs by FN tunneling or avalanche injection across a single oxide layer.

In addition, this approach addresses the issue of retention in devices where a single layer DT oxide is used, such as nano-crystal devices, because the double barrier prevents charge leakage. Nonvolatility is possible because, as the current-voltage characteristics of the present invention demonstrate, just as with FN or avalanche devices and in contrast to single layer DT diodes, there exists a large bias region between the write and erase bias levels where charge is not readily transported across the barrier.

Having described specific preferred embodiments of the invention with reference to the accompanying drawings, it will be appreciated that the present invention is not limited to those specific embodiments, and that various changes and modifications in form, size, arrangement of parts, materials and details of operation, can be effected therein by one of ordinary skill in the art without departing from the scope or spirit of the invention as defined by the appended claims.

What is claimed is:

1. A tunnel barrier for use in semiconductor devices adapted for association with a silicon substrate and a top gate material, said barrier comprising:
   A. a first thin silicon oxide layer adapted for contact with said silicon substrate, said first thin silicon oxide layer having a tunnel thickness of less than about 5.0 nm;
   B. an intermediate layer of silicon in contact with said first thin silicon layer;

C. a second thin silicon oxide layer comparable in thickness to said first thin silicon oxide layer, in contact with said silicon layer, and adapted for contact with said top gate material; and D. said intermediate silicon layer is a vapor deposited, undoped or lightly doped polycrystalline or nano-crystalline layer and has a thickness of less than about 5.0 nm;

wherein said barrier functions to transfer charge across said barrier by tunneling other than resonant tunneling through the oxide layers via a conduction or valence band of the intermediate layer of silicon and exhibits resistance to unwanted charge leakage, dielectric degradation and dielectric failure.

2. The tunnel barrier of claim 1, wherein said intermediate silicon layer has a thickness comparable to that of said first silicon oxide layer.

3. The tunnel barrier of claim 1, wherein said first and said second thin silicon oxide layers are comprised of amorphous silicon oxide, and said silicon layer is comprised of polycrystalline or nano-crystalline silicon.

4. The tunnel barrier of claim 1, wherein said silicon oxide layers comprise thermally grown amorphous layers and have an electrical thickness of about 3.4 nm.

5. A diode structure comprising a silicon substrate, a top gate material and the tunnel barrier of claim 1.

6. The diode structure of claim 5, wherein said silicon oxide layers comprise thermally grown amorphous layers and have an electrical thickness of about 3.4 nm.

7. The diode structure of claim 5, wherein at least a portion of said silicon substrate in contact with the barrier comprises an n-type crystalline silicon.

8. The diode structure of claim 7, wherein said n-type crystalline silicon substrate in contact with the barrier is doped with about $3 \times 10^{16}$ phosphorous atoms per $cm^3$.

9. The diode structure of claim 6, wherein at least a portion of said top gate material in contact with the barrier comprises an n-type polycrystalline silicon.

10. The diode structure of claim 9, wherein said n-type polycrystalline silicon is doped with about $1 \times 10^{20}$ phosphorous atoms per $cm^3$.

11. The diode structure of either claim 7 or claim 9 wherein at least a portion of said silicon substrate and top gate material in contact with the barrier are doped near or beyond degeneracy.

12. An integrated circuit including a tunnel barrier, wherein the tunnel barrier comprises the barrier of claim 1.

13. An integrated circuit including a diode, wherein the diode comprises the diode of claim 5.

14. A nonvolatile memory device including the integrated circuit of claim 12.

15. A nonvolatile memory device including the integrated circuit of claim 13.

16. A tunnel barrier for use in semiconductor devices adapted for association with a silicon substrate and a top gate material, said barrier comprising:

A. an approximate 3.4 nm thermally grown amorphous silicon oxide layer;

B. an approximate 5.0 nm undoped intermediate polycrystalline or nano-crystalline silicon layer deposited by chemical vapor deposition; and C. an approximate 5.0 thermally grown amorphous silicon oxide layer;

wherein said barrier functions to transfer charge across said barrier by tunneling other than resonant tunneling through the oxide layers via a conduction or valence band of the intermediate layer of silicon and exhibits resistance to unwanted charge leakage, dielectric degradation and dielectric failure.

17. A diode structure comprising a silicon substrate, a top gate material and the tunnel barrier of claim 16, wherein at least a portion of said silicon substrate in contact with the barrier comprises an n-type crystalline silicon doped with $\sim 3 \times 10^{16}$ phosphorous atoms per $cm^3$, and at least a portion of said top gate material in contact with the barrier comprises a polycrystalline silicon doped approximately to degeneracy with $\sim 1 \times 10^{20}$ phosphorous atoms per $cm^3$.

18. A tunnel barrier for use in semiconductor devices adapted for association with a silicon substrate and a top gate material, said barrier comprising:

A. a first thin silicon oxide layer adapted for contact with said silicon substrate, said first thin silicon oxide layer having a direct tunnel thickness of less than about 5.0 nm;

B. an intermediate silicon layer of the group consisting of polycrystalline and nano-crystalline in contact with said first thin silicon oxide layer;

C. a second thin silicon oxide layer comparable in thickness to said first thin silicon oxide layer, in contact with said silicon layer, and adapted for contact with said top gate material; and D. means for transferring charge across said barrier by direct tunneling through the oxide layers via a conduction or valence band of the intermediate layer of silicon.

19. The tunnel barrier according to claim 18 wherein said barrier includes at least two oxide layers.

20. A tunnel barrier for use in semiconductor devices adapted for association with a silicon substrate and a top gate material, said barrier comprising:

A. a first thin silicon oxide layer adapted for contact with said silicon substrate, said first thin silicon oxide having a direct tunnel thickness of less than about 5.0 nm;

B. an intermediate silicon layer of the group consisting of polycrystalline and nano-crystalline in contact with said first thin silicon oxide layer;

C. a second thin silicon oxide layer comparable in thickness to said first thin silicon oxide layer, in contact with said silicon layer, and adapted for contact with said gate material; and D. means for resisting direct tunneling charge leakage via the intermediate silicon layer.

21. The tunnel barrier according to claim 20 wherein said means for resisting charge leakage includes a voltage bias region adapted to provide little or no tunnel leakage.

22. The tunnel barrier according to claim 21 wherein said voltage bias region is adapted at least in part due to the presence of few or no tunnel states in the band gap of said intermediate silicon layer.

23. The tunnel barrier according to claim 21 wherein said voltage bias region is $-1 \text{ V} < V_{bias} < \pm 0.5 \text{ V}$.

24. A tunnel barrier for use in semiconductor devices adapted for association with a silicon substrate said a top gate material, said barrier comprising:

A. a first thin silicon oxide layer adapted for contact with said silicon substrate, said first thin silicon oxide having a direct tunnel thickness of less than about 5.0 nm;
B. an intermediate silicon layer of the group consisting of polycrystalline and nano-crystalline in contact wit said first thin silicon layer,
C. a second thin silicon oxide layer comparable in thickness to said first thin silicon oxide layer, in contact with said silicon layer, and adapted for contact with said top gate material; and
D. means for resisting dielectric degradation and dielectric failure via sequential direct tunneling trough the first and second oxide layers.

25. The tunnel barrier according to claim 24 wherein said means for resisting degradation is said oxide layers having at least one characteristic direct tunnel degradation voltage threshold.

26. The tunnel barrier according to claim 25 wherein said means for resisting degradation includes charges across said oxide layers that are below said voltage threshold such that reliability and resistance to degradation are improved.

27. The tunnel barrier according to claim 25 wherein said oxide layers include asymmetrical positive and negative thresholds.

28. The tunnel barrier according to claim 27 wherein said positive threshold is 1 volt and said negative is 3 volts.

* * * * *